United States Patent
Deisch

(10) Patent No.: US 7,564,305 B2
(45) Date of Patent: Jul. 21, 2009

(54) SYSTEM AND METHOD FOR SELF-CANCELLATION OF $N^{th}$-ORDER INTERMODULATION PRODUCTS

(75) Inventor: Cecil W. Deisch, Warrenville, IL (US)

(73) Assignee: Tellabs Operations, Inc., Naperville, IL (US)

( * ) Notice: Subject to any disclaimer, the term of this patent is extended or adjusted under 35 U.S.C. 154(b) by 91 days.

(21) Appl. No.: 11/938,537

(22) Filed: Nov. 12, 2007

(65) Prior Publication Data

US 2009/0121788 A1    May 14, 2009

(51) Int. Cl.
   *H03F 1/26* (2006.01)
(52) U.S. Cl. ...................... 330/149; 375/297
(58) Field of Classification Search ............... 330/149; 375/297; 455/114.3
   See application file for complete search history.

(56) References Cited

U.S. PATENT DOCUMENTS

| | | | |
|---|---|---|---|
| 6,344,810 B2 * | 2/2002 | Velazquez | 341/118 |
| 6,396,344 B1 * | 5/2002 | Gentzler et al. | 330/149 |
| 6,498,926 B1 * | 12/2002 | Ciccarelli et al. | 455/240.1 |
| 6,570,514 B1 * | 5/2003 | Velazquez | 341/118 |
| 6,794,936 B2 * | 9/2004 | Hsu et al. | 330/149 |
| 6,831,512 B2 * | 12/2004 | Cavers et al. | 330/149 |
| 7,262,948 B2 | 8/2007 | Deisch | |
| 2007/0127181 A1 | 6/2007 | Deisch | |

OTHER PUBLICATIONS

M. Ibrahim Khalil. "Characterizing Intermodulation Distortion of High-Power Devices." *High Frequency Electronics* 6(7) (2007): 26-33.

\* cited by examiner

*Primary Examiner*—Henry K Choe
(74) *Attorney, Agent, or Firm*—Fitzpatrick, Cella, Harper & Scinto

(57) ABSTRACT

A method for reducing distortion in a nonlinear device whereby $n^{th}$-order intermodulation products are canceled. A test signal is applied to the input of the nonlinear device and amplitudes of $n^{th}$- and $m^{th}$-order intermodulation products are measured. Transfer function coefficients and an optimum value of a baseband resistance are calculated. A baseband resistance is applied to an output of the device. An input signal is applied to the input of the device and a $m^{th}$-order intermodulation product is passed through the baseband resistance and added back to the input. A system for practicing the same includes a signal source that generates the test signal, a unit that measures the intermodulation products, a unit that calculates the transfer function coefficients and the optimum value of a baseband resistance, and a unit that applies the baseband resistance to the output of the device.

26 Claims, 7 Drawing Sheets

SYSTEM AND METHOD FOR SELF-CANCELLATION OF $N^{th}$-ORDER INTERMODULATION PRODUCTS

BACKGROUND

1. Field

Example aspects of the invention relate generally to reducing distortion from electrical devices, and more particularly to an improved system and method for reducing or canceling $n^{th}$-order intermodulation products of nonlinear electronic devices.

2. Description of the Related Art

Nonlinear electronic devices are ubiquitous in modern technologies and find myriad uses in telecommunications, computing, and military applications. Many applications of these devices require a linear response, i.e., to achieve maximum performance, the output signal from the device must be proportional to the input signal. One example of linear performance desired from a nonlinear device is the amplification of a telecommunications signal by a power amplifier. In this example, the signal is a band comprised of multiple frequencies or channels. Because this signal must share the radio frequency (RF) spectrum with other signals, linear performance is required from the amplifier because any nonlinear amplification creates frequencies outside the signal band, which may contaminate or interfere with other telecommunications signals, resulting in signal degradation and increased error rates.

At a low power level, the response of a typical amplifier is approximately linear; the nonlinear distortion of an amplifier at low output power is often negligible. However, as the output power increases, so does the nonlinear distortion. One source of distortion is the intermodulation, or intermixing, of the different frequency components comprising the input signal. Intermodulation generated by the nonlinearities in the amplifier results in intermodulation products, which can increase exponentially with the amplifier gain. At high output power, the output signal of a nonlinear amplifier may be substantially compromised by these intermodulation products. In turn, these intermodulation products can interfere with other signals outside the frequency band of the input signal. However, high output power is often necessary to meet performance requirements, such as cost, power consumption, and device footprint.

In some instances, intermodulation products resulting from the high-gain amplification of an input signal may be removed from the output signal by signal filtering techniques, such as the use of high-pass, low-pass, or band-pass filters. However, certain intermodulation products occur at or near the frequency of the input signal. These distortions often prove difficult to remove from the output signal. For example, some third-order intermodulation products are comprised of frequencies comparable to the input signal frequencies; bands of these third-order intermodulation products can overlap with and fall outside of the desired linear amplification of the input signal. Thus, the aforementioned signal filtering techniques cannot be easily used to filter these intermodulation products from the desired amplified output.

For applications requiring high amplifier gain, there are two common schemes for improving amplifier linearization: predistortion and postdistortion. In a predistortion approach, a nonlinear amplifier is modeled or measured in order to characterize the nonlinear response of the amplifier. A predistortion circuit is then designed which compensates the input signal for the intermodulation products, or distortion, that will be added to the signal upon amplification. Thus, the circuit predistorts the input signal; when the predistorted signal is amplified, the result is an output signal nearly linear with the original input signal. Postdistortion is analogous to predistortion but the compensation for the amplifier nonlinearities is added to the signal after amplification.

Both of these methods have limitations, including complex pre- or postdistortion circuitry, high power consumption, and limited actual reduction of the intermodulation products. Another approach to improving amplifier linearization is the use of feedforwarding techniques. However, these also require complicated circuits and increase total amplifier cost. Additionally, feedforward circuitry can be difficult to control, particularly at high frequencies. Through comparison with the example embodiments set forth below, further limitations of the above-mentioned approaches will become apparent.

SUMMARY

According to an example embodiment of the invention, a method for canceling $n^{th}$-order intermodulation products of a nonlinear device includes applying a test signal to the input of the device, measuring the amplitudes of $n^{th}$- and $m^{th}$-order intermodulation products, calculating coefficients of the transfer function of the device, and calculating an optimum value of a baseband resistance. By applying the baseband resistance to the output of the device, when an input signal is applied to the device, a resulting $m^{th}$-order intermodulation product can be passed through the baseband resistance and added back to the input of the device. In this manner, the intermodulation of the added $m^{th}$-order intermodulation product and the input signal can cancel the $n^{th}$-order intermodulation products.

According to another example embodiment of the invention, a system for canceling $n^{th}$-order intermodulation products of a nonlinear device includes a first apparatus comprised of a test signal source, a measuring unit, and a calculating unit, and a second apparatus comprised of a baseband resistor unit. The test signal source applies test signals to the input of the nonlinear device. The measuring unit measures intermodulation products in the output signal of the device. The calculating unit calculates both transfer function coefficients and an optimum value of a baseband resistance. The baseband resistor unit applies the baseband resistance to the output of the nonlinear device.

According to another example embodiment of the invention, an apparatus for canceling $n^{th}$-order intermodulation products of a nonlinear device comprises a test signal source, a measuring unit, a calculating unit, and a baseband resistor unit. The test signal source applies test signals to the input of the nonlinear device. The measuring unit measures intermodulation products in the output signal of the device. The calculating unit calculates both transfer function coefficients and an optimum value of a baseband resistance. The baseband resistor unit applies the baseband resistance to the output of the nonlinear device.

According to yet another example embodiment of the invention, computer program for canceling $n^{th}$-order intermodulation products of a nonlinear amplifier comprises code to apply a test signal to the input of a nonlinear device, measure the amplitudes of $m^{th}$- and $n^{th}$-order intermodulation products, and calculate both transfer function coefficients and an optimum value of the baseband resistance. The program can also include code to apply the baseband resistance to the output of the device in order to pass the $m^{th}$-order baseband through the resistance and back to the input of the nonlinear device.

Further features and advantages, as well as the structure and operation, of various example embodiments are described in detail below with reference to the accompanying drawings.

DETAILED DESCRIPTION

Figure 1:
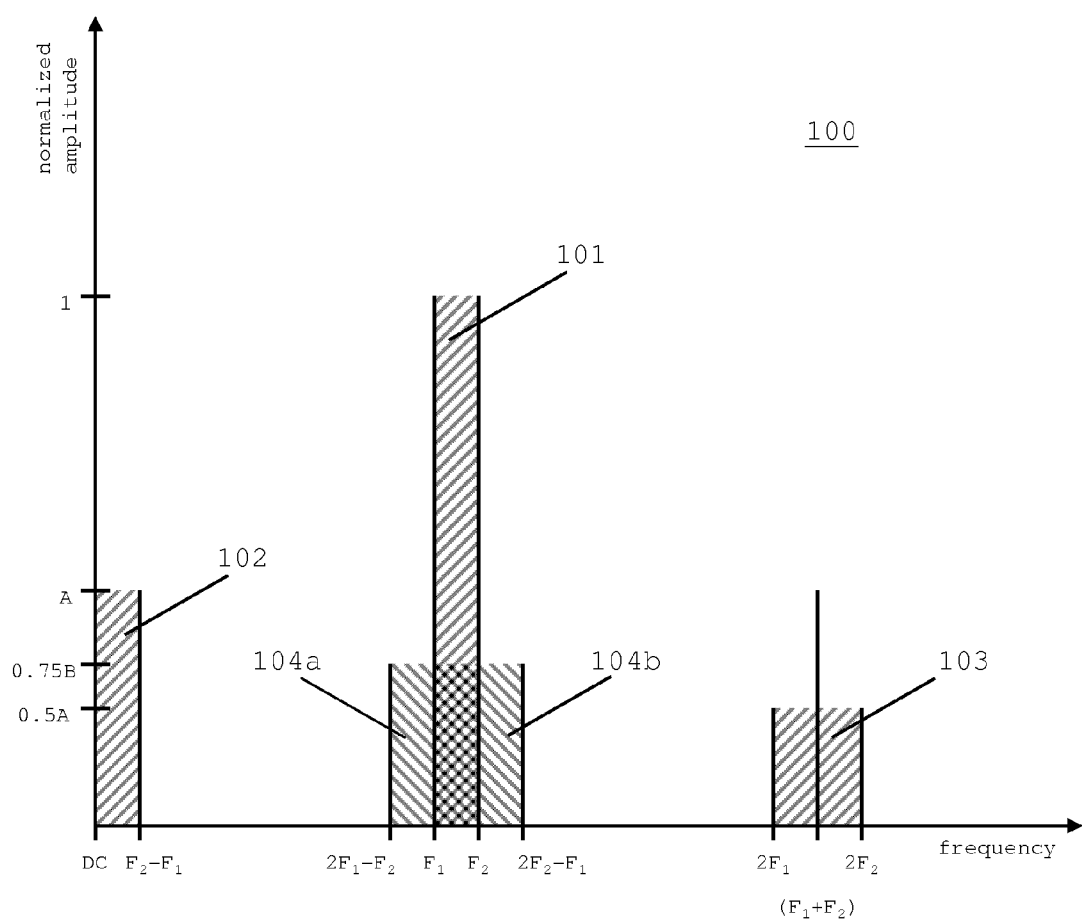
FIG. 1 shows an example frequency-domain response of a nonlinear amplifier to an input signal band comprised of a plurality of frequency components, including second-order and some third-order intermodulation products.

According to example embodiments of the invention, an improved method, system, apparatus, and computer program are provided for canceling $n^{th}$-order intermodulation products of a nonlinear device. A common but not exclusive application requiring cancellation of $n^{th}$-order intermodulation products is the linear operation of a nonlinear amplifier at high output power. When the $n^{th}$-order intermodulation products are canceled, the amplifier may be linearly operated at a higher output power than if the $n^{th}$-order intermodulation products were not canceled.

As used herein, the term "amplifier" can refer to any 2- or 3-terminal electronic device, such as diodes, power and RF amplifiers, multipliers and limiters.

Intermodulation occurs when the input to a nonlinear device is comprised of two or more frequencies. As an example, if an input signal containing three components at frequencies $F_1$, $F_2$, and $F_3$ is passed through the nonlinear device, the output signal will contain the three frequencies of the input signal, as well as a number of linear combinations of the fundamental frequencies, each having a frequency of the form $k_1F_1+k_2F_2+k_3F_3$, where the coefficients $k_1$, $k_2$ and $k_3$ are integers. These linear combinations are the intermodulation products. In general, the frequency components comprising the output signal will have a different amplitude and phase, depending upon the specific nonlinear transfer function of the nonlinear device, and also on the amplitudes and phases of the original input components.

Intermodulation products may be categorized by their "order." The order of a particular intermodulation product is defined as the sum of the absolute value of the coefficients comprising its linear combination of fundamental frequencies. For example, given the input signal described above, third-order intermodulation products would occur where $|k_1|+|k_2|+|k_3|=3$. Linear combinations that satisfy this relationship, i.e., third-order intermodulation products, include, for example: $F_1+F_2+F_3$; $F_1+F_2-F_3$; $2F_1+F_2$; and $2F_2-F_3$. The example methods below describe the use of intermodulation products of one order, e.g., $m^{th}$-order intermodulation products, to reduce or cancel intermodulation products of another order, e.g., $n^{th}$-order intermodulation products. For example, second-order intermodulation products can be used to cancel or reduce third-order intermodulation products; in accordance with the mathematical notation used herein, for these particular embodiments m=2 and n=3.

Those skilled in the art will recognize that the response of an example nonlinear amplifier to an input voltage may be approximated by a normalized transfer function:

$$y=x+Ax^2+Bx^3; \qquad (1)$$

where y represents the output voltage of the amplifier when a current x is fed to its input. Those with skill in the art will appreciate that the transfer function in equation (1) is both time- and frequency-independent, and has been normalized such that the linear amplifier gain and DC bias current are factored into y.

Higher-order terms have been omitted from the transfer function in equation (1). Thus, this equation describes a third-order approximation of the nonlinear transfer function, where A is a normalized second-order coefficient and B is a normalized third-order coefficient. These coefficients influence the amplitude of the second- and third-order intermodulation products.

FIG. 1 shows an example frequency-domain response 100 of a nonlinear amplifier to an input signal band comprised of a plurality of frequency components. The frequency-domain response 100 represents the output signal of an example nonlinear amplifier. The input signal band comprises a plurality of frequency components ranging from a lower bound of $F_1$ to an upper bound of $F_2$. It is to be understood that the individual frequency components of the input signal band may have various amplitudes and phases. The input signal band is the signal for which amplification is desired. The input signal band may represent mobile phone transmissions, satellite transmissions, any other sort of telecommunications signal, or any other band of signals that may require amplification or other processing.

The linear amplification of the input signal band results in an output band 101, which has a lower bound at $F_1$ and an upper bound at $F_2$. The linear amplification resulting in the output band 101 occurs according to the first-order term in the nonlinear transfer function, i.e. x in equation (1) above. The output band 101 comprises a desired amplified signal.

In addition to the amplification of the input signal band, intermodulation products result from the intermixing of the frequency components of the input signal band. These intermodulation products include a second-order baseband 102, a second-order harmonic band 103, a third-order lower sideband 104a, a third-order upper sideband 104b and other higher-frequency third-order components (not shown). Higher-order intermodulation products resulting from higher-order terms in the transfer function, e.g., $x^4$ and $x^5$ terms, are also not shown in FIG. 1 because these terms have been omitted from the transfer function of equation (1).

Intermodulation products having frequencies outside of and away from the frequency range of the output band 101 can often be removed by known signal filtering techniques. For example, the second-order baseband 102 and the second-order harmonic band 103 can be removed from the output of the nonlinear amplifier by the use of, for example, a lowpass filter or bandpass filter. However, intermodulation products occurring at frequencies near to or within the frequency range of the output band 101 may not always be easily removed by filtering. Thus, the occurrence of third-order lower sideband 104a and the third-order upper sideband 104b at frequencies comparable to the output band 101 can preclude the use of signal filtering techniques to remove these intermodulation products from the desired output signal of the amplifier. Furthermore, the overlap of the third-order lower sideband 104a and the third-order upper sideband 104b with the output band 101, as depicted by the darkened area at the base of the output band 101, can distort the output signal within the desired amplified frequency range. Thus, it is an example aspect of the invention to remove these third-order intermodulation products from the output signal of a nonlinear amplifier.

The relative amplitudes of the elements depicted in the frequency-domain response 100 in FIG. 1 should not be construed as limiting or constraining the actual response of any nonlinear amplifier or other nonlinear device utilized in connection with any example embodiment of the invention.

Figure 2:
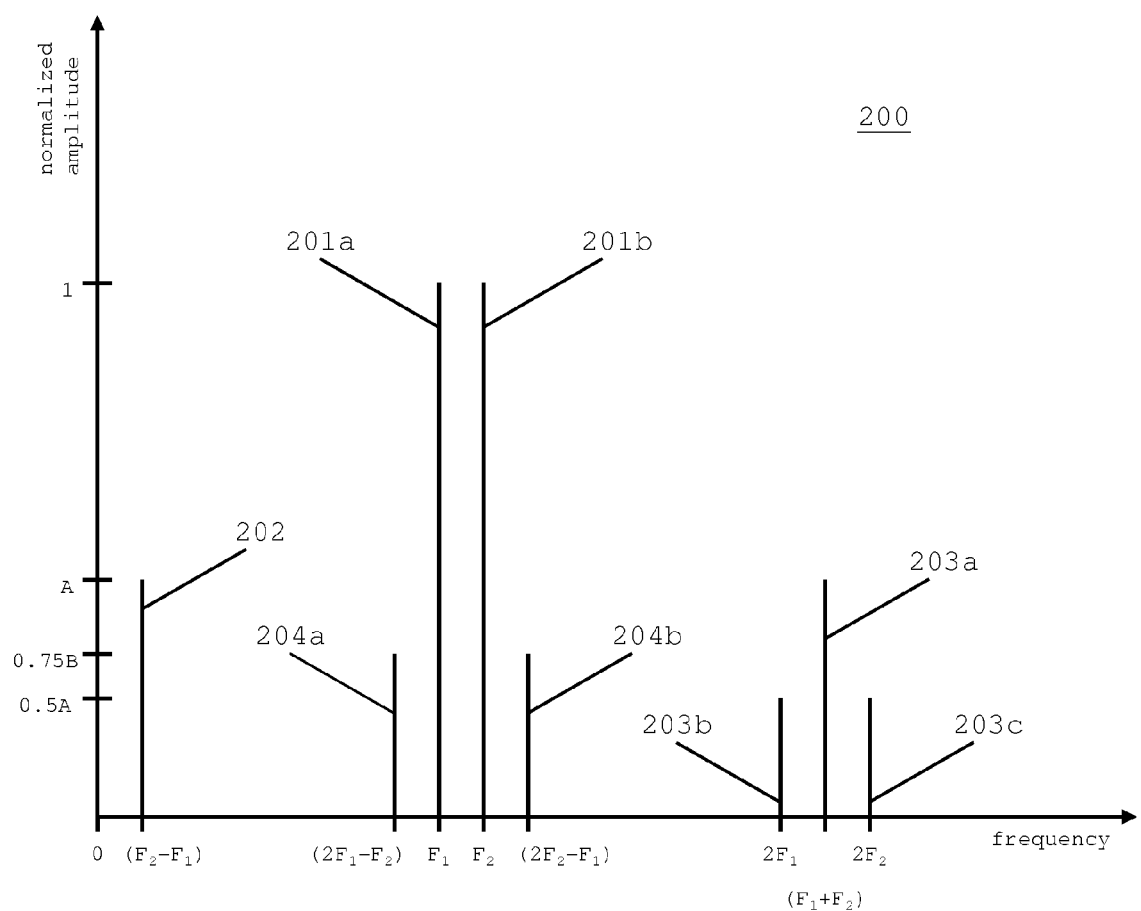
FIG. 2 shows an example frequency-domain response of a nonlinear amplifier to a two-tone input signal, including second-order and some third-order intermodulation products.

FIG. 2 shows an example frequency-domain response 200 of an example nonlinear amplifier to a two-tone input signal. The frequency-domain response 200 represents the output signal of the example nonlinear amplifier. The two-tone input signal may be comprised of two frequency components having equal amplitude and phase. Hereinafter, the two-tone input signal will be referred to as a test signal. As an example, the frequency components of the test signal can be sinusoidal, although other waveforms may be used. One component has a frequency $F_1$, and the other component has a frequency $F_2$. Although frequencies $F_1$ and $F_2$ may be arbitrarily chosen, $F_1$, and $F_2$ can also be chosen to represent, for example, the lower bound and upper bounds, respectively, of an input signal band for which linear amplification is desired.

Amplification of the test signal results in amplified tones 201a-b. The amplified tone 201a has a frequency $F_1$ and is a linear amplification of the component of the test signal with frequency $F_1$. Similarly, the amplified tone 201b is a linear amplification of the component of the test signal with frequency $F_2$. In FIG. 2, the amplitudes of amplified tones 201a-b have been normalized to unity; the actual amplitudes of amplified tones 201a-b are understood to be greater than the amplitudes of the frequency components of the test signal by an amount in proportion to the amplifier gain.

In addition to the amplification of the frequency components of the test signal, intermodulation products result from the intermixing of the two frequency components. The intermodulation products include a second-order DC component (not shown), a second-order baseband 202, second order harmonics 203a-c, a third-order lower sideband 204a, a third-order upper sideband 204b and higher-frequency third-order products (not shown). As used herein, the terms "baseband" and "sideband" may refer to both a single frequency as well as a range or band of frequencies; with respect to FIG. 2, "baseband" and "sideband" refer to single frequencies.

The second-order baseband 202 results from an intermixing of the two frequency components of the test signal, and is a second-order intermodulation product. Given the test signal discussed above and by known mathematical manipulation of the normalized transfer function of equation (1), one skilled in the art will recognize that a normalized amplitude of the second-order baseband 202 is equal to A. For example, if the amplitudes of amplified tones 201a-b are normalized to equal 1 V and second-order baseband 202 has a normalized amplitude of 0.126 V, then the value of A is equal to 0.126.

The third-order lower sideband 204a and the third-order upper sideband 204b are third-order intermodulation products, and also result from the intermixing of the two frequency components of the input signal. Again, by mathematical manipulation of equation (1), one skilled in the art will recognize that the normalized amplitudes of the third-order lower sideband 204a and the third-order upper sideband 204b are equal to 0.75 B. For example, if the amplitudes of amplified tones 201a-b are normalized to equal 1 V, the third-order lower sideband 204a is measured at a normalized amplitude of 0.01 V, and the third-order upper sideband 204b is also measured at a normalized amplitude of 0.01 V, then the value of B is equal to 0.0133. Depending upon the frequencies of the components of the test signal, the third-order lower sideband 204a and the third-order upper sideband 204b may have frequencies similar to the frequencies of amplified tones 201a-b.

The normalized amplitudes of the elements depicted in the frequency-domain response 200 of FIG. 2 should not be construed as limiting or constraining any actual, normalized, or relative response of any nonlinear amplifier utilized in connection with any example embodiment of the invention.

Having described an example output of a nonlinear amplifier resulting from both an input signal band and a test signal, the self-cancellation of third-order intermodulation products will now be described. In accordance with the test signal and output discussed in connection with FIG. 2, the second-order baseband 202 can be removed from the output signal by the use of, for instance, a frequency-limited resistor that appears as a resistance at the frequency of the second-order baseband 202, but as an open circuit at higher frequencies. If the current from the second-order baseband 202 is removed from the output and fed back into the input of the amplifier, the intermodulation of this added second-order baseband and the frequency components of the test signal can reduce or cancel the third-order lower sideband and the third-order upper sideband produced by third-order intermodulation of the test signal. This cancellation, called self-cancellation, can be proven by those skilled in the art by mathematical computation of the transfer function of equation (1) or determined through experimentation.

As an illustration of self-cancellation, consider a test signal having frequency components at 100 Hz and 110 Hz. If this test signal is applied to a nonlinear amplifier as described above, the test signal will be amplified and intermodulation products will result. The second-order baseband can have a frequency of 10 Hz, the third-order lower sideband can have a frequency of 90 Hz, and the third-order upper sideband can have a frequency of 120 Hz. If the 10 Hz second-order baseband is removed from the output signal and added back into the input of the nonlinear amplifier along with the test signal, additional intermodulation products, also at 90 Hz and 120 Hz, can result. The 90 Hz intermodulation product results from the frequency subtraction of the 10 Hz second-order baseband from the 100 Hz component of the test signal, and the 120 Hz intermodulation product results from the frequency addition of the 10 Hz second-order baseband and the 110 Hz component of the test signal. Because the additional intermodulation products have frequencies corresponding to the third-order lower and upper sidebands, the additional intermodulation products can cancel the third-order sidebands through destructive interference, i.e., if the additional intermodulation products are out of phase with the third-order sidebands. Thus, by adjusting the amplitude and phase of the second-order baseband added back into the input of the amplifier, the resulting 90 Hz and 120 Hz intermodulation products can reduce or cancel the 90 Hz third-order lower sideband and 120 Hz third-order upper sideband.

To achieve optimal self-cancellation, the frequency and amplitude of the additional intermodulation products should match the corresponding third-order sideband, but have a phase shift of 180 degrees, thus completely cancelling the third-order sideband. As described above, the frequencies of the additional intermodulation products can often match the frequencies of the sidebands due to the mathematical relationship between the input and output of an amplifier as governed by the nonlinear transfer function. The amplitudes and phases of the additional intermodulation products can be adjusted, for example, via the frequency-limited resistor or by another circuit element. In some instances, the amplitude and phase of the second-order baseband fed back into the input may be such that no additional adjustment is necessary. For instance, if the amplifier imparts a natural 180 degree input-to-output phase shift, the second-order baseband can have an optimal phase for self-cancellation. In other cases, the constituent resistance and reactance of the impedance of the frequency-limited resistor can be adjusted so that an optimal phase and amplitude is achieved. Similarly, those with skill in the art will recognize that known circuit elements can be added to adjust the amplitude and phase of the second-order baseband removed from the output signal.

The self-cancellation of third-order intermodulation products described above can be similarly applicable to the input signal band and output discussed in connection with FIG. 1. The amplification of the input signal band will result in the output signal band 101, as well as second-order baseband 102, third-order lower sideband 104a and third-order upper sideband 104b. The second-order baseband can be removed from the output signal by, for example, a frequency-limited resistor or other circuit element, and added back to the input. The concurrent amplification of the added second-order baseband and the input signal band can result in additional intermodulation products having frequencies equal to the third-order sidebands. In this instance, the additional intermodulation products can be frequency bands, rather than the individual frequencies discussed above in connection with FIG. 2. By optimizing the amplitude and phase of the additional intermodulation products, the third-order lower sideband 104a and the third-order upper sideband 104b can be reduced or canceled.

The foregoing example frequencies were chosen for the sake of mathematical simplicity and should not be construed to limit the frequency range of any embodiment of the invention. Frequencies used in the various example embodiments may range from at least extremely low frequencies (ELF) to extremely high frequencies (EHF).

The amplitude of the second-order baseband added back into the amplifier can be adjusted by the use of, for example, a baseband resistor, an optimum resistance value of which can be determined by the equation:

$$R = \frac{A^2}{0.75B} - 1; \qquad (2)$$

where R is the optimum value for the resistance of the baseband resistor, A is the normalized second-order coefficient of the normalized transfer function discussed above, and B is the normalized third-order coefficient of the normalized transfer function. As an example, using the values of A and B discussed in connection with FIG. 2, the optimum value for the resistance is 0.59 ohms. The values of A and B may result in a value of R that is positive, zero, or even negative. As such, the baseband resistor may be comprised of any electrical components, materials or circuitry that allow it to accommodate any and all calculated values of R, including negative values.

The phase of the second-order baseband added back into the input of the amplifier may also be adjusted. The adjustment of the phase may occur in addition to and independent of the adjustment of the amplitude of the second-order baseband. The phase may be adjusted by altering the reactance of an impedance used for the baseband resistance, or by altering a circuit element or electrical device independent of the baseband resistor, or by any other known phase-altering technique.

Figure 3:
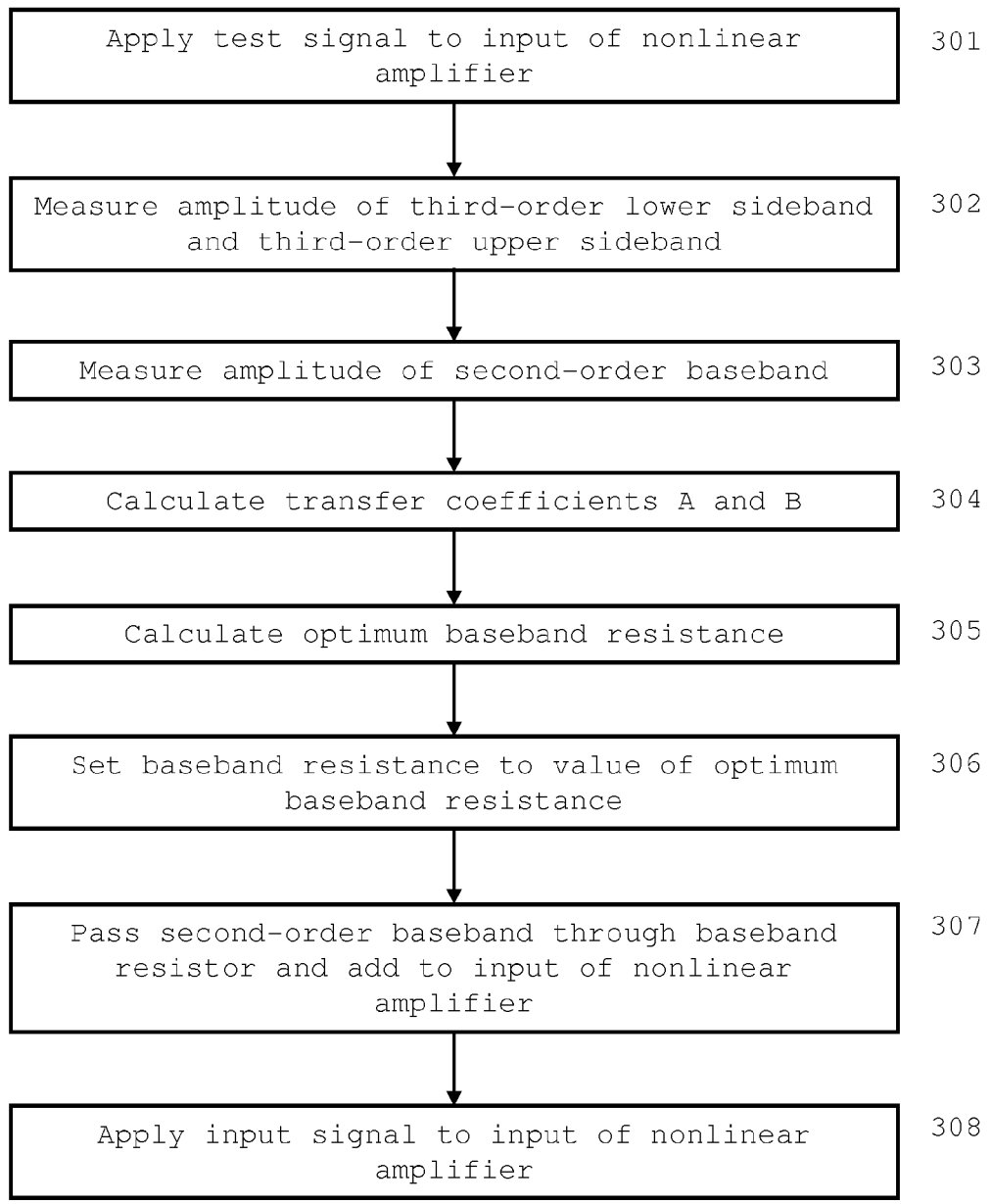
FIG. 3 is a flowchart of a method in accordance with an example embodiment of the invention.

A flowchart of a method in accordance with an example embodiment of the invention is shown in FIG. 3. In block 301, a test signal is applied to an input of a nonlinear amplifier. The test signal may be comprised of, for example, two sinusoidal components of equal amplitude and phase, the components further having respective frequencies equal to the lower and upper bounds of the signal band desired to be amplified. For instance, if the input signal band desired to be amplified occupies a frequency range of 3.0 GHz to 3.1 GHz, i.e., the input signal band is 100 MHz in width, then the two sinusoidal components should have respective frequencies of 3.0 GHz and 3.1 GHz. Of course, this example embodiment and others are not limited to a single frequency band, and the sinusoidal components of the test signal can be arbitrarily chosen for any frequency range desired.

In block 302, the amplitudes of a third-order lower sideband and a third-order upper sideband are measured. These third-order intermodulation products at least partially comprise the output of the nonlinear amplifier in response to the test signal. The measurement of these amplitudes may be made according to a computer program code, any kind of electronic or mechanical trigger or series of triggers, or any other set of commands, including human interaction, and may be made using an oscilloscope, a frequency or spectrum analyzer, or any other signal-measuring tool. In block 303, the amplitude of a second-order baseband is measured. The measurement may be made in any manner as described in connection with block 302, although it need not be made in the same manner as either the third-order lower sideband or third-order upper sideband measurements. The amplitudes measured in blocks 302 and 303 may be normalized such that the amplitudes of the amplified test signal frequency components are substantially equal to unity. Normalization may take place on a scale such as volts, decibels, decibel-meters or the like, and may include conversions between scales.

Transfer function coefficients A and B are calculated in block 304. Coefficient A may be calculated using the relation that the normalized amplitude of the second-order baseband is equal to A, where the normalized amplitude of the second-order baseband is in volts. Coefficient B may be calculated using the relation that the normalized amplitude of either the third-order lower sideband or third-order upper sideband is equal to 0.75 B, where the normalized amplitude of either sideband is in volts. The calculation of B may incorporate either or both sideband amplitudes, and may further include mathematical operations on the amplitudes of the third-order lower sideband and third-upper sideband, including averaging, weighted averaging, or the like. An optimum baseband resistance R is calculated in block 305. As an example, the optimum baseband resistance may be calculated using equation (2) above. The calculations in blocks 304 and 305 may be made by, for example, human calculation or computer program code. Furthermore, the calculations in blocks 304 and 305 need not be made in the same manner.

In block 306, a resistance of a baseband resistor to be connected to the amplifier is set according to the value of the optimum baseband resistance calculated in block 305. The baseband resistor can be a frequency-limited resistor, acting as a pure resistance at frequencies corresponding to the second-order baseband resulting from a desired input signal band, and further acting as an open circuit at frequencies higher than the second-order baseband intermodulation products. The baseband resistor may also comprise other circuit elements known in the art for removing some frequencies of a multi-frequency signal, and need not necessarily include a frequency-limited resistor. Thus, as used herein, the term "baseband resistor" is to be understood in its broadest sense, and contemplates any circuit elements used to arbitrarily remove frequencies from an electrical signal. The baseband resistor may be part of a larger baseband resistor unit and may be set by, for example, mechanical or electrical switching, and may be controlled by, for example, computer program code or human interaction.

In block 307, the baseband resistor is connected to the nonlinear amplifier in such a way that a second-order baseband output of the nonlinear amplifier may be sent through the baseband resistor and added back into the input of the nonlinear amplifier. The connection may be made as part of, for example, a manual or automatic process, and may be controlled by, for example, computer program code or human interaction. In block 308, the input signal for which amplification is desired is applied to the input of the nonlinear amplifier. The test signal may be removed from the input of the amplifier at block 308, or it may be removed at any other time following the measurements at blocks 302 and 303. In this manner, the self-cancellation of third-order intermodulation products can occur.

Figure 4:
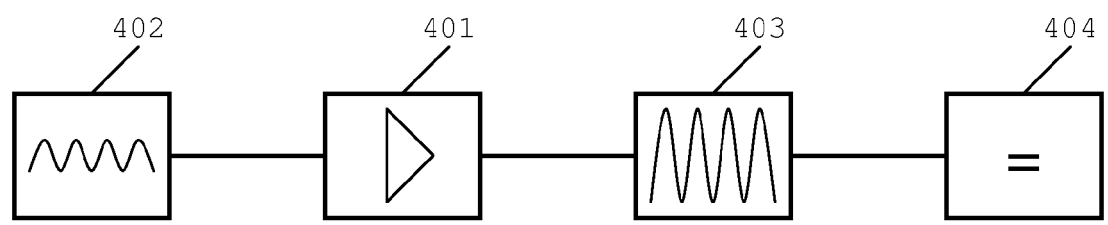
FIG. 4 illustrates an apparatus which may be used in accordance with an aspect of an example embodiment of the invention.

FIG. 4 illustrates an apparatus which may be used in accordance with an aspect of an example embodiment of the invention. This apparatus can be used to measure intermodulation products formed by the amplification of a test signal, and also to calculate an optimized resistance for a baseband resistor. A test signal source 402 is connected to a nonlinear amplifier 401. The test signal source 402 sends test signals to the nonlinear amplifier 401. Examples of test signal sources include multi-tone generators or one or more individual signal generators. The test signal sent by the test signal source 402 may be comprised of, for example, two frequency components having equal amplitude and phase, the first with a frequency $F_1$ equal to a lower bound of an input signal band to be amplified, and the second with a frequency $F_2$ equal to the upper bound of the band to be amplified. The test signal is then amplified by the nonlinear amplifier 401 according to its transfer function.

A measuring unit 403 receives an output from nonlinear amplifier 401. The measuring unit 403 measures the amplitudes of signals output from amplifier 401, and may be comprised of, for example, an oscilloscope, a spectrum analyzer, or any suitable measuring device. In an example embodiment, the measuring unit 403 measures the amplitudes of the frequency components of the amplified test signal, as well as the amplitudes of the second-order baseband, the third-order lower sideband, and the third-order upper sideband.

The calculating unit 404 uses the amplitude values measured by the measuring unit 403 to calculate second-order normalized coefficient A and third-order normalized coefficient B of the transfer function of the nonlinear device 401. The calculating unit 405 also calculates an optimum value of the baseband resistance using, for example, equation (2) above.

Figure 5:
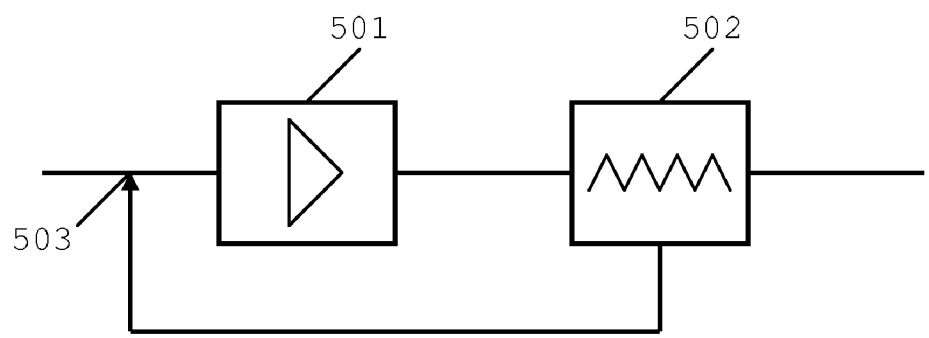
FIG. 5 illustrates another apparatus which may be used in accordance with an aspect of an example embodiment of the invention.

FIG. 5 illustrates another apparatus which may be used in accordance with an aspect of an example embodiment of the invention. This apparatus can be used to add a second-order baseband back into the input of a nonlinear amplifier. A baseband resistor unit 502 is connected in series with a nonlinear amplifier 501. The baseband resistor unit 502 comprises at least one baseband resistor. The baseband resistor has a resistance which can be set to a positive, zero or negative resistance. Furthermore, the baseband resistor may be a frequency-limited resistor. In an example embodiment, the resistance of the baseband resistor of the baseband resistor unit 502 can be set to the optimized value of the baseband resistance as calculated by the calculating unit 404 of FIG. 4. In this example embodiment, the nonlinear amplifier 501 can be the same amplifier as the nonlinear amplifier 401 of FIG. 4. Thus, the normalized transfer function coefficients A and B for the nonlinear amplifier 501 and the optimized value of a baseband resistance for the baseband resistor unit 502 may be determined prior to the assembly or configuration of the presently-described apparatus.

A connection between an output of the baseband resistor unit 502 back to the input of nonlinear amplifier 501 is established through a connection 503. Through the connection 503, the second-order baseband output from the nonlinear amplifier 501 and sent to the baseband resistor unit 502 can be added back to the input of the nonlinear amplifier 501. In this manner, the apparatus of FIG. 5 can reduce or cancel third-order intermodulation products produced by the nonlinear amplifier 501.

Figure 6:
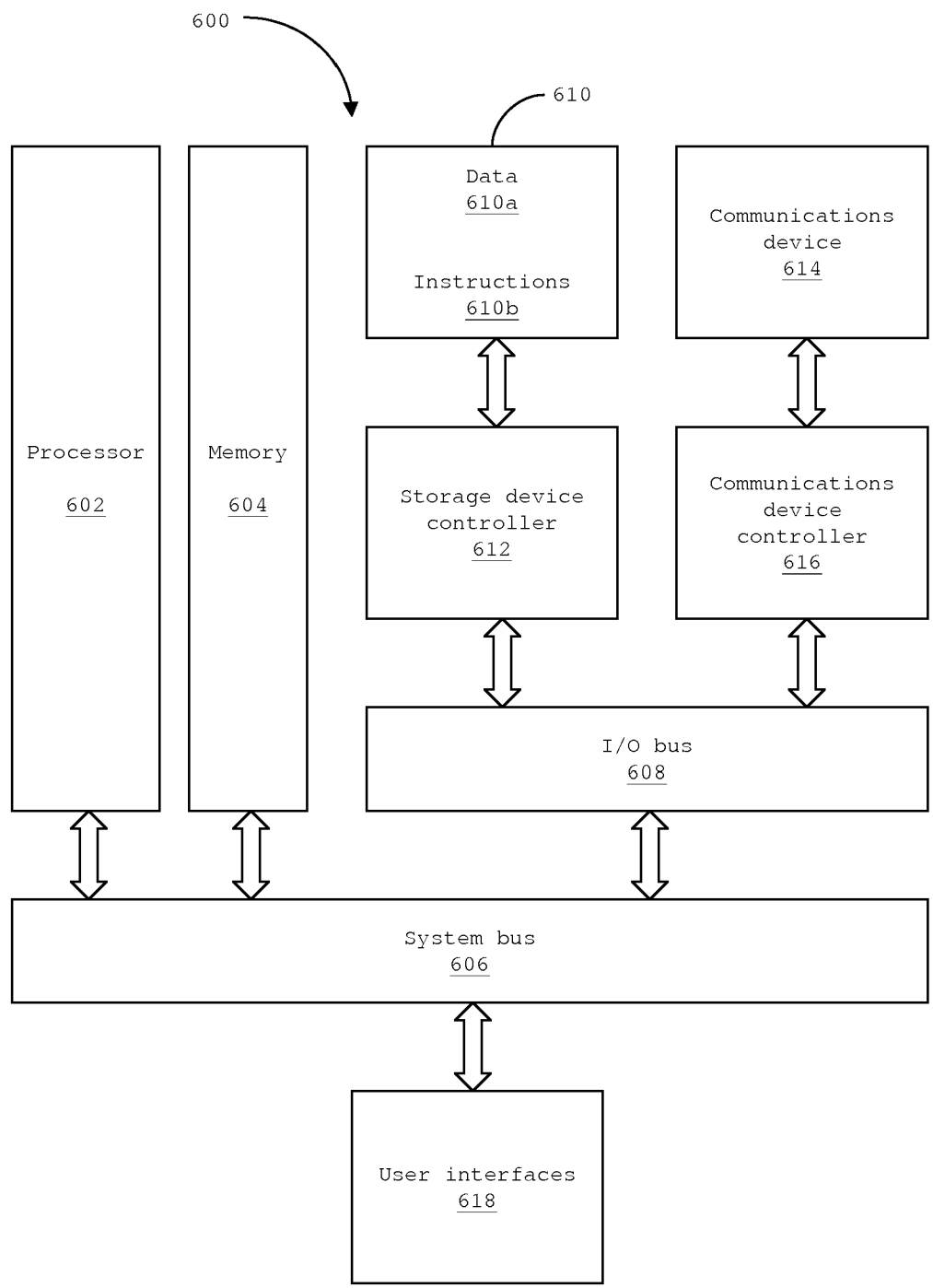
FIG. 6 is a diagram of an example data processing system which may be used in accordance with one or more example embodiments of the invention.

FIG. 6 is a diagram of an example data processing system which, according to an example embodiment of the invention, can be incorporated into, for example, test signal source 402, calculating unit 403, and measuring unit 404 of FIG. 4, and baseband resistor unit 502 of FIG. 5. Data processing system 600 includes a processor 602 coupled to a memory 604 via a system bus 606. The processor 606 may also coupled to external devices via the system bus 606 or the input/output (I/O) bus 608. The processor may be coupled to at least one user interface 618. The processor 606 may be further coupled to a communications device 614 via a communications device controller 616 coupled to the I/O bus 608. The processor 606 uses the communications device 614 to communicate with external systems and networks, and the communications device 614 may have one or more I/O ports. Processor 602 also can include an internal clock (not shown) to keep track of time and periodic time intervals. The user interfaces 618 may include, for example, at least one of a keyboard, mouse, or other suitable user-operable input device, and at least one of a video display, printer, or any other suitable output device enabling a user to receive outputted information.

A storage device 610 having a computer-readable medium is coupled to the processor 602 via a storage device controller 612, the I/O bus 608 and the system bus 606. The storage device 610 is used by the processor 602 and storage device controller 612 to read and write data 610a, and to store program instructions 610b. Alternately, program instructions 610b can be stored directly in non-volatile or volatile portions of memory 604. Program instructions 610b may be used to implement the procedures described above, including those discussed in connection with FIGS. 3-5.

The storage device 610 also stores various routines and operating systems that are used by the processor 602 for controlling the operation of system 600. At least one of the operating systems stored in storage device 610 may include the TCP/IP protocol stack for implementing a known method for connecting to the Internet or another network.

In operation, the processor 602 loads the program instructions 610b from the storage device 610 into the memory 604. The processor 602 then executes the loaded program instructions 610b to perform any of the example methods described above for operating the system 600. The program instructions 610b can enable a device to request, receive, and process instructions and information originating from another device and to send information and instructions to other devices.

Figure 7:
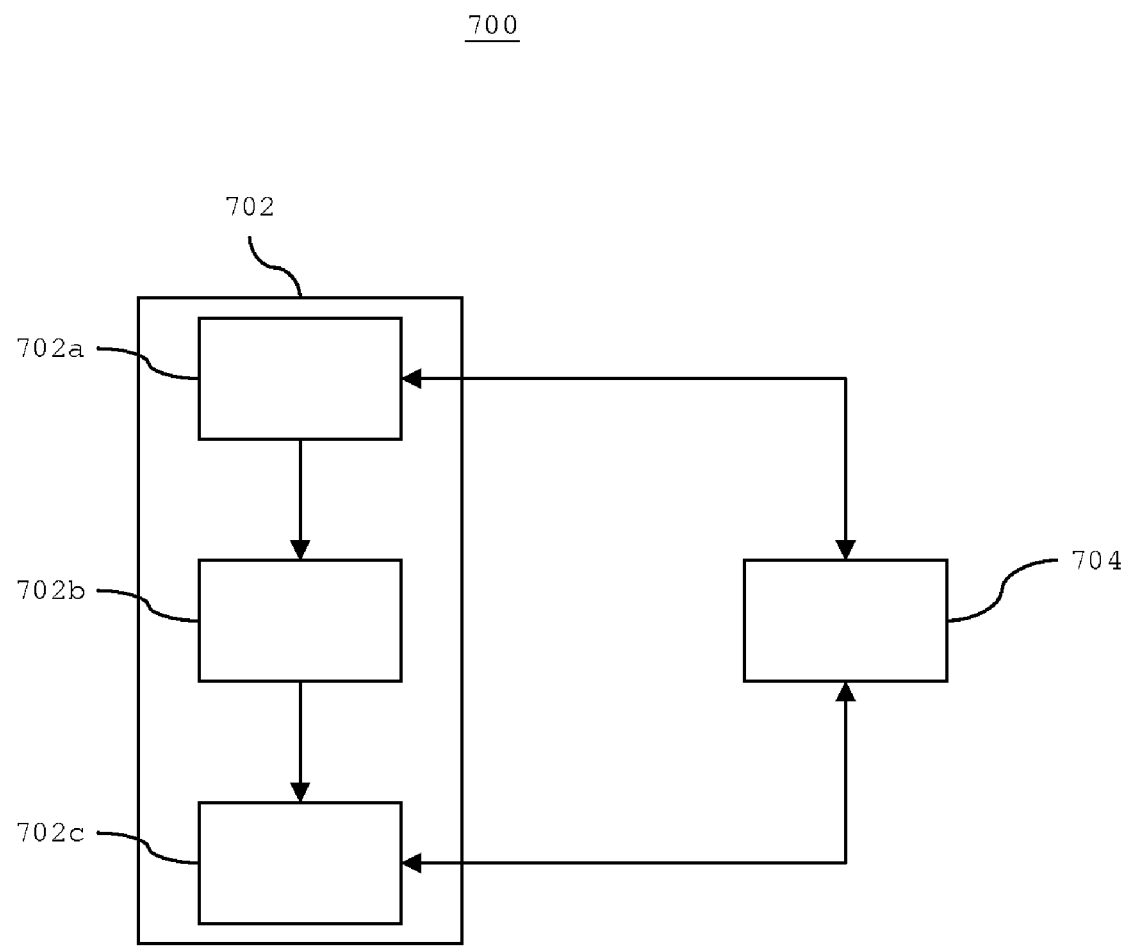
FIG. 7 is a logical diagram of an example circuit device which may be used in accordance with one or more example embodiments of the invention.

FIG. 7 illustrates a logical diagram 700 of the modules of example circuit devices such as, for example, application-specific integrated circuits (ASICs) or field-programmable gate arrays (FPGAs), which could be used as system elements, e.g., test signal source 402, measuring unit 403 and calculating unit 404 of FIG. 4, and baseband resistor unit 502 of FIG. 5, in accordance with one or more example embodiments. The modules may include hardware circuitry, software, and/or combinations thereof. In an example embodiment, software routines for performing the modules depicted in logical diagram 700 can be stored as instructions 610b in a storage device 610 and executed by processor 602 of one or more data processing systems 600, as shown in FIG. 6. Logical diagram 700 includes a control module 702 for controlling the circuit device and a communication module 704 for directing information between control module 702 and other circuit devices.

The control module 702 includes a sub-module 702a that stores and receives information such as internal commands and functions, and instructions generated by other circuit devices; a sub-module 702b arranged to perform a predetermined function, e.g., the application of a test signal source, the measurement of intermodulation products, or the calculation of a baseband resistance; and a sub-module 702c arranged to interpret and analyze information resulting from the function of sub-module 702b, and to provide information to communication module 704.

The communication module 704 can send to and receive from sub-module 702a information such as, for example, commands and settings necessary for the function of sub-module 702b. The communication module 706 can also send information to and receive information from sub-module 702c.

By virtue of the example embodiments described herein, $n^{th}$-order intermodulation products output by a nonlinear device can be reduced or canceled. By passing an $m^{th}$-order intermodulation product through a baseband resistor and adding the intermodulation product back into the input of the nonlinear amplifier, a self-cancellation of the $n^{th}$-order intermodulation products of the output of the nonlinear device can occur.

Although example embodiments of the invention have been described in a context involving second- and third-order intermodulation products, broadly construed, these embodiments are not so limited, and can be applied to other higher-order intermodulation products. One having ordinary skill in the art would appreciate, in light of this description, how to adapt equation (1) and the example embodiments in manner suitable for higher-order intermodulation products.

In the foregoing description, example aspects of the invention are described with reference to specific example embodiments. Despite these specific embodiments, many additional modification and variations would be apparent to those skilled in the art. Thus, it is to be understood that the example embodiments may be practiced in a manner otherwise than as specifically described. Accordingly, the specification is to be regarded in an illustrative rather than restrictive fashion. It will be evident that modifications and changes may be made thereto without departing from the broader spirit and scope.

Similarly, it should be understood that the figures are presented solely for example purposes. The architecture of the example embodiments presented herein is sufficiently flexible and configurable such that it may be practiced and navigated in ways other than those shown in the accompanying figures. Moreover, the systems and apparatuses described herein may be used in a standalone fashion or in combination with other signal processing devices.

Software embodiments of the example embodiments presented herein may be provided as a computer program product, or software, that may include an article of manufacture on a machine-accessible or machine-readable medium having instructions. The instructions on the machine-accessible or machine-readable medium may be used to program a computer system or other electronic device. The machine-readable medium may include, but is not limited to, floppy diskettes, optical disks, CD-ROMs, and magneto-optical disks or other type of media suitable for storing or transmitting electronic instructions. The techniques described herein are not limited to any particular software configuration. They may find applicability in any computing or processing environment. As used herein, the terms "machine-accessible" or "machine-readable" shall include any medium capable of storing, encoding, or transmitting an instruction or sequence of instructions for execution by the machine such that the machine performs any one or more of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Furthermore, the purpose of the foregoing abstract is to enable the U.S. Patent and Trademark Office, the general public, and scientists, engineers, and practitioners in the art who are unfamiliar with patent or legal terms or phrases, to quickly determine from a cursory inspection the nature and essence of the technical disclosure of the application. The abstract is not intended to limit the scope in any way.

It is also to be understood that the processes recited in the claims need not be performed in the order presented.

What is claimed is:

1. A method for canceling $n^{th}$-order intermodulation products of a nonlinear device, comprising:
   applying a test signal to an input of a nonlinear device;
   measuring amplitudes of $n^{th}$-order intermodulation products and $m^{th}$-order intermodulation products;
   calculating transfer function coefficients; and
   calculating an optimum value of a baseband resistance.

2. The method of claim 1, further comprising:
   applying the baseband resistance to an output of the nonlinear device.

3. The method of claim 2, further comprising:
   applying an input signal to the input of the nonlinear device.

4. The method of claim 3, further comprising:
   passing at least one of the $m^{th}$-order intermodulation products through the baseband resistance; and
   adding the at least one of the $m^{th}$-order intermodulation products to the input of the nonlinear device.

5. The method of claim 1, wherein m=2 and n=3.

6. The method of claim 5, wherein the test signal comprises a first component and a second component,
   wherein a frequency of the first component corresponds to a lower bound of a band of an input signal, and a frequency of the second component corresponds to an upper bound of the band of the input signal,
   wherein the first component and the second component have equal amplitude and phase.

7. The method of claim 6, wherein the $n^{th}$-order intermodulation products comprise a third-order lower sideband and a third-order upper sideband, and the $m^{th}$-order intermodulation products comprise a second-order baseband.

8. The method of claim 7, wherein the transfer function coefficients comprise a second-order coefficient and a third-order coefficient,
wherein the second-order coefficient is proportional to an amplitude of the second-order baseband, and the third-order coefficient is proportional to both an amplitude of the third-order lower sideband and an amplitude of the third-order upper sideband.

9. The method of claim 8, wherein the optimum value of the baseband resistance is calculated according to the equation:

$$R = \frac{A^2}{0.75B} - 1,$$

wherein R equals the optimum value of the baseband resistance, A equals the second-order coefficient, and B equals the third-order coefficient.

10. A system for canceling $n^{th}$-order intermodulation products of a nonlinear device comprising a first apparatus and a second apparatus,
wherein the first apparatus comprises a test signal source for applying a test signal to an input of a nonlinear device; a measuring unit for measuring amplitudes of $n^{th}$-order intermodulation products and $m^{th}$-order intermodulation products; and a calculating unit for calculating transfer function coefficients and an optimum value of a baseband resistance,
wherein the second apparatus comprises a baseband resistor unit for applying the baseband resistance to an output of the nonlinear device.

11. The system of claim 10, wherein m=2 and n=3.

12. The system of claim 11, wherein the test signal comprises a first component and a second component,
wherein a frequency of the first component corresponds to a lower bound of a band of an input signal, and a frequency of the second component corresponds to an upper bound of the band of the input signal,
wherein the first component and the second component have equal amplitude and phase.

13. The system of claim 12, wherein the $n^{th}$-order intermodulation products comprise a third-order lower sideband and a third-order upper sideband, and the $m^{th}$-order intermodulation products comprise a second-order baseband.

14. The system of claim 13, wherein the transfer function coefficients comprise a second-order coefficient and a third-order coefficient,
wherein the second-order coefficient is proportional to an amplitude of the second-order baseband, and the third-order coefficient is proportional to both an amplitude of the third-order lower sideband and an amplitude of the third-order upper sideband.

15. The system of claim 14, wherein the optimum value of the baseband resistance calculated by the calculating unit is calculated according to the equation:

$$R = \frac{A^2}{0.75B} - 1,$$

wherein R equals the optimum value of the baseband resistance, A equals the second-order coefficient, and B equals the third-order coefficient.

16. An apparatus for canceling $n^{th}$-order intermodulation products of a nonlinear device comprising:

a test signal source for applying a test signal to an input of a nonlinear device;
a measuring unit for measuring amplitudes of $n^{th}$-order intermodulation products and $m^{th}$-order intermodulation products;
a calculating unit for calculating transfer function coefficients and an optimum value of a baseband resistance; and
a baseband resistor unit for applying the baseband resistance to an output of the nonlinear device.

17. The apparatus of claim 16, wherein m=2 and n=3.

18. The apparatus of claim 17, wherein the test signal comprises a first component and a second component,
wherein a frequency of the first component corresponds to a lower bound of a band of an input signal, and a frequency of the second component corresponds to an upper bound of the band of the input signal,
wherein the first component and the second component have equal amplitude and phase.

19. The apparatus of claim 18, wherein the $n^{th}$-order intermodulation products comprise a third-order lower sideband and a third-order upper sideband, and the $m^{th}$-order intermodulation products comprise a second-order baseband.

20. The apparatus of claim 19, wherein the transfer function coefficients comprise a second-order coefficient and a third-order coefficient,
wherein the second-order coefficient is proportional to an amplitude of the second-order baseband, and the third-order coefficient is proportional to both an amplitude of the third-order lower sideband and an amplitude of the third-order upper sideband.

21. The apparatus of claim 20, wherein the optimum value of the baseband resistance is calculated according to the equation:

$$R = \frac{A^2}{0.75B} - 1,$$

wherein R equals the optimum value of the baseband resistance, A equals the second-order coefficient, and B equals the third-order coefficient.

22. A computer program embodied in a computer-readable storage medium, the program comprising code to control a system to:
apply a test signal to an input of a nonlinear device;
measure amplitudes of $n^{th}$-order intermodulation products and $m^{th}$-order intermodulation products; and
calculate transfer function coefficients and an optimum value of a baseband resistance.

23. The computer program of claim 22, further comprising code to control a system to apply the baseband resistance to an output of the nonlinear device.

24. The computer program of claim 23, further comprising code to control a system to apply an input signal to the input of the nonlinear device.

25. The computer program of claim 24, further comprising code to control a system to:
pass at least one of the $m^{th}$-order intermodulation products through the baseband resistance; and
add the at least one of the $m^{th}$-order intermodulation products to the input of the nonlinear device.

26. The computer program of claim 22, wherein m=2 and n=3.

* * * * *